(12) United States Patent
Liu et al.

(10) Patent No.: US 9,831,832 B2
(45) Date of Patent: Nov. 28, 2017

(54) LOW NOISE AMPLIFIER HAVING TRANSFORMER FEEDBACK AND METHOD OF USING THE SAME

(71) Applicant: TAIWAN SEMICONDUCTOR MANUFACTURING COMPANY, LTD., Hsinchu (TW)

(72) Inventors: Yi-Hsuan Liu, Hualien (TW); Hsieh-Hung Hsieh, Taipei (TW); Tzu-Jin Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 35 days.

(21) Appl. No.: 14/700,546

(22) Filed: Apr. 30, 2015

(65) Prior Publication Data

US 2016/0322939 A1 Nov. 3, 2016

(51) Int. Cl.
*H03F 1/22* (2006.01)
*H03F 1/02* (2006.01)
*H03F 3/193* (2006.01)
*H03F 1/34* (2006.01)

(52) U.S. Cl.
CPC .......... *H03F 1/0205* (2013.01); *H03F 1/0261* (2013.01); *H03F 1/223* (2013.01); *H03F 1/347* (2013.01); *H03F 3/193* (2013.01); *H03F 2200/117* (2013.01); *H03F 2200/168* (2013.01); *H03F 2200/18* (2013.01); *H03F 2200/294* (2013.01); *H03F 2200/451* (2013.01)

(58) Field of Classification Search
CPC .......... H03F 1/565; H03F 3/195; H03F 3/245; H03F 3/45179; H03F 2203/45551; H03F 1/22; H03F 1/223; H03H 7/38; H03H 7/42

USPC ..... 330/116–117, 256, 301, 79, 311; 455/78, 455/311; 327/563

See application file for complete search history.

(56) References Cited

U.S. PATENT DOCUMENTS

| | | | |
|---|---|---|---|
| 7,193,475 B2 | 3/2007 | Su et al. | |
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 2009/0108937 A1* | 4/2009 | Yamaguchi | H03F 1/14 330/260 |

(Continued)

FOREIGN PATENT DOCUMENTS

JP 2012-191600 10/2012

OTHER PUBLICATIONS

Yao et al. "Current Reuse Gains UWB LNA", Microwaves & RF, Feb. 2014, pp. 66-50.*

(Continued)

*Primary Examiner* — Steven J Mottola
*Assistant Examiner* — Hafizur Rahman
(74) *Attorney, Agent, or Firm* — Hauptman Ham, LLP

(57) ABSTRACT

A low noise amplifier (LNA) includes a first transistor and a second transistor. A source of the second transistor is connected to a drain of the first transistor. The LNA further includes a feedback transformer. A gate of the first transistor is connected to a primary winding of the feedback transformer and a gate of the second transistor is connected to a secondary winding of the feedback transformer.

20 Claims, 4 Drawing Sheets

(56) References Cited

U.S. PATENT DOCUMENTS

| | | |
|---|---|---|
| 2010/0052784 A1* | 3/2010 | Yamaguchi ............... H03F 1/22 330/252 |
| 2012/0092230 A1 | 4/2012 | Hung et al. |
| 2012/0218041 A1 | 8/2012 | Nineyama |
| 2013/0113562 A1 | 5/2013 | Giammello et al. |
| 2013/0234305 A1 | 9/2013 | Lin et al. |
| 2014/0132333 A1 | 5/2014 | Jin et al. |
| 2014/0217546 A1 | 8/2014 | Yen et al. |
| 2014/0253262 A1 | 9/2014 | Hsieh et al. |
| 2014/0253391 A1 | 9/2014 | Yen |

OTHER PUBLICATIONS

Yanbin et al., "A high linearity SiGe HBT LNA for GPS receiver", Journal of Semiconductors, vol. 35, No. 4, Apr. 2014, pp. 045001-1-045001-6.*

Office Action dated Jul. 20, 2016 and English translation from corresponding No. KR 10-2015-0164524.

Notice of Allowance dated Dec. 23, 2016 and English translation from corresponding application No. KR 10-2015-0164524.

* cited by examiner

LOW NOISE AMPLIFIER HAVING TRANSFORMER FEEDBACK AND METHOD OF USING THE SAME

BACKGROUND

Ultra-low power devices are used in mobile communications, such as Bluetooth® Smart, mobile phones, or watches; home electronics, automation, computing devices or other internet of things (IOT) devices. Ultra-low power devices are designed to consume less power in comparison with other technologies. In some instances, power consumption of an ultra-low power device ranges from about 0.01 Watts (W) to about 0.5 W. Ultra-low power devices which receive an input signal from another device often include a low noise amplifier (LNA) configured to increate an amplitude of the received input signal.

An LNA is one of the largest power consumption devices in a receiving device. In some instances, the LNA accounts for about 30% of the power consumption for the entire receiving. In some instances, reducing power consumption of the LNA reduces an amplitude of an input signal used by the receiving device and negatively impacts performance of the receiving device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
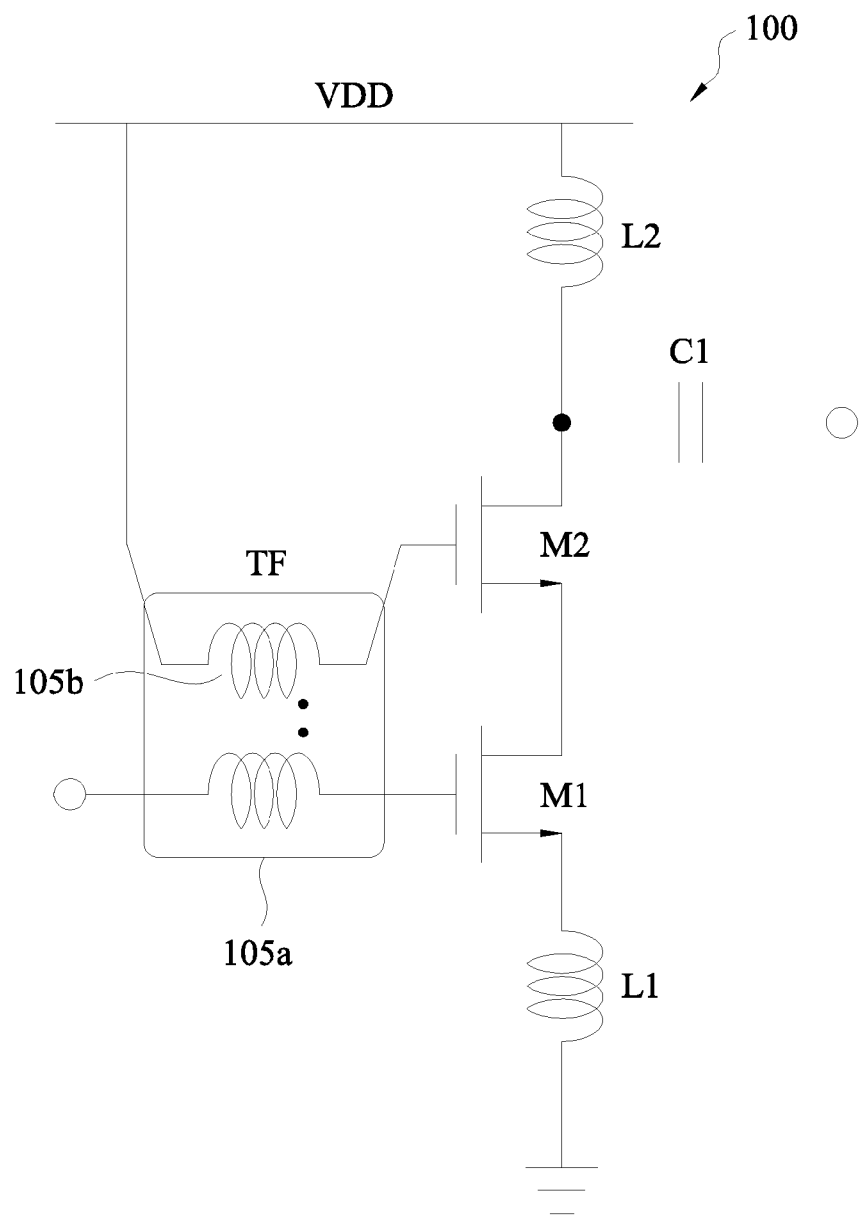
FIG. 1 is a schematic diagram of a low noise amplifier (LNA) having a transformer feedback in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An ultra-low power low noise amplifier (LNA) helps to increase an amplitude of an input signal for use by other circuits within a device. Power consumption of a LNA is able to be reduced by operating the LNA near a near-threshold voltage of elements within the LNA. The near-threshold voltage is a voltage which is close to an activation, i.e., threshold, voltage at which a transistor transitions from a non-conductive state to a conductive state. In some embodiments, a power consumption of a LNA operated near the threshold voltage consumes about 15% to about 20% of a power supply for the device. In comparison, other LNAs which operate at a super-threshold voltage consume approximately 30% of the power supply for other devices. The super-threshold voltage is a voltage which is significantly above the activation, i.e., threshold, voltage at which a transistor transitions from a non-conductive state to a conductive state. In comparison with a near-threshold voltage, a transistor operated at the super-threshold voltage operates at a maximum conductivity. In comparison with operating the LNA at the super-threshold voltage level, the near-threshold voltage operation of the LNA exhibits an increased current density. The increased current density in turn facilitates a reduction in power consumption, for increasing battery life, or an increase in a number of active devices which are able to be operated, for increasing a functionality of the device while maintaining power consumption. A reduced power consumption helps to reduce an overall size of a power storage device, such as a battery, and therefore decrease the overall size of the device. Increasing a number of active devices operable at a same power consumption increases functionality of the device without a significant increase in a size of the device.

The LNA is able to be operated near the threshold voltage by biasing elements within the LNA. In some embodiments, the biasing voltage is applied to a gate of the elements within the LNA. In some embodiments, the biasing voltage is applied to a bulk of the elements within the LNA.

However, operating the LNA near the threshold voltage makes the LNA more sensitive to corner variation. Corner variation is an inherent variation in the performance of devices caused by variations in a manufacturing process. For example, wafer to wafer variation due to drift within a manufacturing tool results in different performance of elements on a first wafer in comparison with elements on a second wafer, in some instances. Additionally, within wafer variation due to variations of conditions across a surface of a wafer results in different performance of elements at various locations across the wafer, in some instances. As a result of these variations in the manufacturing process, certain LNAs have different performance characteristics. Operating the LNAs near the threshold voltage makes the performance of the LNAs more sensitive to these variations.

FIG. 1 is a schematic diagram of a LNA 100 having a feedback transformer TF in accordance with some embodiments. LNA includes a first inductor L1 having a first side connected to a reference voltage. A second side of first inductor L1 is connected to a source of a first transistor M1. A drain of first transistor M1 is connected to a source of a second transistor M2. A gate of first transistor M1 is connected to a first end of a primary winding 105a of feedback transformer TF. A gate of second transistor M2 is connected to a first end of a secondary winding 105b of feedback transformer TF. A drain of second transistor M2 is connected to a first side of a second inductor L2 and to a first side of a first capacitor C1. An output node is connected to a second side of first capacitor C1. A second side of second inductor L2 is connected to a supply voltage VDD. A second end of the primary winding 105a of feedback transformer TF is connected to an input node. A second end of the secondary winding 105b of feedback transformer TF is connected to reference voltage VDD.

In some instances, first transistor M1 in LNA 100 is called a common source gain stage. In some instances, second transistor M2 in LNA 100 is called a common gate gain stage. In some instances, a structure of LNA 100 is called a cascode structure.

Feedback transformer TF is configured to control a voltage level supplied to the gate of first transistor M1 and the gate of second transistor M2 and to maintain the voltage supplied to the gate of the first transistor and the gate of the second transistor in a same phase, i.e., no phase shift. A polarity of feedback transformer TF is a subtractive polarity as indicated by the dot notation in FIG. 1. By controlling the voltage level, a performance of first transistor M1 and a performance of second transistor M2 are more precise regardless of corner variation. Feedback transformer TF is able to control the voltage level supplied based on a number of turns in the primary winding 105a of the feedback transformer and a number of turns in the secondary winding 105b of the feedback transformer. As a number of turns increases a voltage level on a respective side of feedback transformer increases and a current output by the respective side of the feedback transformer decreases. In some embodiments, a ratio of the number of turns on the primary winding 105a of feedback transformer TF to the number of turns on the secondary winding 105b of the feedback transformer ranges from about 1,000:1 to about 1:1,000. Feedback transformer TF in LNA 100 helps to reduce power consumption, e.g., DC power consumption, of LNA 100 in comparison with a LNA which does not include the feedback transformer. A decrease in power consumption helps to increase battery life of a device including LNA 100 in comparison with other LNAs.

Windings 105a and 105b of feedback transformer TF include conductive material, such as copper, aluminum, tungsten, Formvar wire, Litz wire, or other suitable conductive material. In some embodiments, a core of feedback transformer TF includes a magnetic material, such as iron, steel, or another suitable magnetic material. In some embodiments, the core of feedback transformer TF is air. In some embodiments, feedback transformer is a core-type construction, a shell-type construction or another suitable construction type.

First transistor M1 and second transistor M2 are n-type metal oxide semiconductor (NMOS) transistors. In some embodiments, first transistor M1 and second transistor M2 are independently selected from p-type metal oxide semiconductor (PMOS) transistor, bipolar junction transistors (BJTs), fin field effect transistors (FinFETs), high electron mobility transistors (HEMTs) or other suitable transistors.

In some embodiments, supply voltage VDD is a constant current supply voltage. In some embodiments, supply voltage VDD is a constant voltage supply voltage. In some embodiments, supply voltage VDD is approximately 0.9 volts (V). In some embodiments, the reference voltage is ground. In some embodiments, the reference voltage is different from ground. In some embodiments, an operating frequency of LNA 100 is less than about 10 GHz. In some embodiments, the operating frequency of LNA 100 is about 2.4 GHz. In some embodiments, the operating frequency of LNA 100 matches an operating frequency of a Bluetooth™ device.

Figure 2:
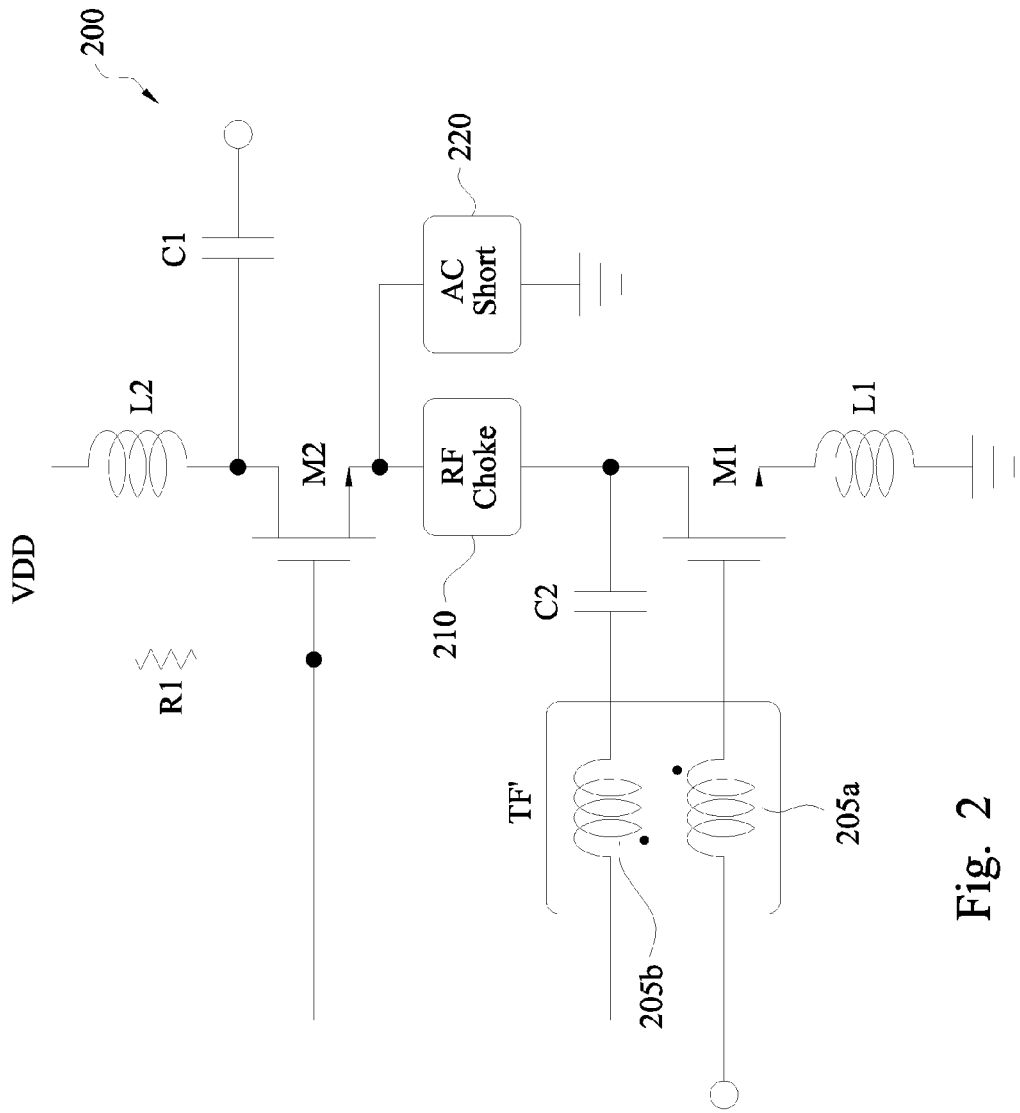
FIG. 2 is a schematic diagram of a LNA having a transformer feedback in accordance with some embodiments.

FIG. 2 is a schematic diagram of a LNA 200 having a feedback transformer TF' in accordance with some embodiments. Common elements between LNA 100 (FIG. 1) and LNA 200 have a same reference character. In comparison with LNA 100, LNA 200 also includes feedback transformer TF' which is configured to control a voltage supplied to the gate of first transistor M1 and the gate of second transistor M2 in out of phase, i.e., a phase shift of 180-degrees. A polarity of feedback transformer TF' is an additive polarity as indicated by the dot notation in FIG. 2. LNA 200 also includes a first resistor R1 connected between supply voltage VDD and the gate of second transistor M2. First resistor R1 is also connected between feedback transformer TF' and supply voltage VDD. A radio frequency (RF) choke 210 is connected between the drain of first transistor M1 and the source of second transistor M2. An alternating current (AC) short 220 is connected between the drain of first transistor M1 and the reference voltage. A second capacitor C2 is connected between feedback transformer TF' and the drain of first transistor M1.

In some instances, first transistor M1 in LNA 200 is called a common source gain stage. In some instances, second transistor M2 in LNA 200 is called a common source gain stage. In some instances, a structure of LNA 200 is called a concurrent structure.

Similar to feedback transformer TF (FIG. 1), feedback transformer TF' is configured to control a voltage level supplied to the gate of first transistor M1 and the gate of second transistor M2 and to maintain the voltage supplied to the gate of the first transistor and the gate of the second transistor. In contrast, with feedback transformer TF, feedback transformer TF' is configured to maintain the voltage applied to the gate of first transistor M1 and the gate of second transistor M2 in an opposite phase, i.e., a phase shift of 180-degrees. By controlling the voltage level, a performance of first transistor M1 and a performance of second transistor M2 are more precise regardless of corner variation.

RF choke 210 helps to provide selective electrical isolation between DC power and RF signals in LNA 200. In some embodiments, RF choke 210 permits propagation of a current associated with the DC power and impedes propagation of current associated with certain frequency bandwidths. In some embodiments, RF choke 210 includes multiple choke devices to impede multiple frequency bandwidths. In some embodiments, RF choke 210 is an LC device which includes an inductor connected in parallel with a capacitor.

AC short 220 provides a path to the reference voltage for frequencies above an operating frequency of LNA 200. In some embodiments, AC short 220 includes a capacitor connected to the reference voltage. In some embodiments, an operating frequency of LNA 200 is less than about 10 GHz. In some embodiments, the operating frequency of LNA 200 is about 2.4 GHz. In some embodiments, the operating frequency of LNA 200 matches an operating frequency of a Bluetooth™ device.

Figure 3:
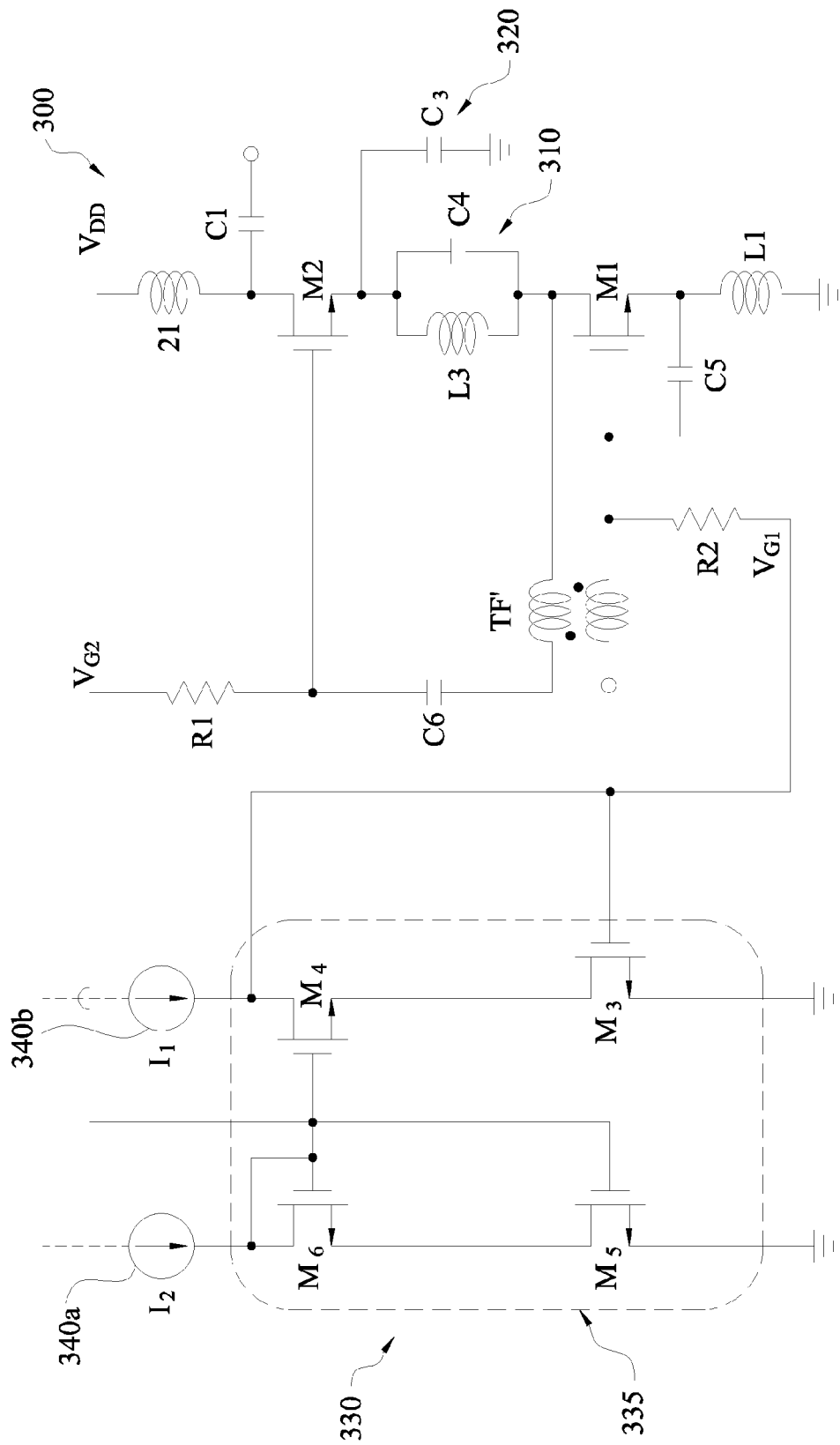
FIG. 3 is a schematic diagram of a LNA having a transformer feedback and a constant current power supply in accordance with some embodiments.

FIG. 3 is a schematic diagram of a LNA 300 including a feedback transformer TF' and a constant current bias circuit 330. Elements of LNA 300 which are the same as elements in LNA 200 (FIG. 2) have a same reference character. In comparison with LNA 200, LNA 300 includes an LC circuit as an RF choke 310. RF choke 310 includes inductor L3 and capacitor C4 connected in parallel between the drain of first transistor M1 and the source of second transistor M2. LNA 300 also includes a capacitor C3 as an AC short 320. Constant current bias circuit 330 is connected to the gate of first transistor M1 and to the gate of second transistor M2. A second resistor R2 is connected between constant current bias circuit 330 and the gate of the first transistor M1. A fifth capacitor C5 is connected between the gate of first transistor M1 and the source of the first transistor. A sixth capacitor C6 is connected between first resistor R1 and feedback transformer TF'.

In some embodiments, an operating frequency of LNA 300 is less than about 10 GHz. In some embodiments, the operating frequency of LNA 300 is about 2.4 GHz. In some embodiments, the operating frequency of LNA 300 matches an operating frequency of a Bluetooth™ device.

Constant current bias circuit 330 is configured to provide a signal to the gate of first transistor M1 and the gate of second transistor M2 which has a constant current. A voltage of the signal provided to the gate of second transistor M2 is determined based on a resistance of first resistor R1. A voltage of the signal provided to the gate of first transistor M1 is determined based on a resistance of second resistor R2. Constant current bias circuit 330 includes a first current generator 340a configured to generate a first current I1 and a second current generator 340b configured to generate a second current I2. In some embodiments, each of the first current generator 340a and the second current generator 340b is a bandgap current source or another suitable current generator.

Constant current bias circuit 330 includes a current mirror 335 configured to mirror first current I1 to the gate of first transistor M1 and second current I2 to the gate of second transistor M2. Current mirror 335 includes a third transistor M3, a fourth transistor M4, a fifth transistor M5 and a sixth transistor M6. A source of third transistor M3 is connected to the reference voltage. A gate of third transistor M3 is connected to second resistor R2. A drain of third transistor M3 is connected to a source of a fourth transistor M4. A drain of fourth transistor M4 is connected to the gate of third transistor M3, to the first current generator and to second resistor R2. A gate of fourth transistor is connected to a gate of a fifth transistor M5, a gate of a sixth transistor M6 and first resistor R1. A source of fifth transistor M5 is connected to the reference voltage. A drain of fifth transistor M5 is connected to a source of sixth transistor M6. A drain of sixth transistor M6 is connected to the gate of the sixth transistor and to the second current source. Each of third transistor M3, fourth transistor M4, fifth transistor M5 and sixth transistor M6 is an NMOS transistor. In some embodiments, at least one of third transistor M3, fourth transistor M4, fifth transistor M5 or sixth transistor M6 is a PMOS transistor, a FinFET, a BJT, a HEMT, or another suitable transistor. In some embodiments, current mirror 335 is replaced with a different current mirroring circuit.

Connecting constant current bias circuit 330 to the gate of first transistor M1 and to the gate of second transistor M2 helps to reduce performance degradation of LNA 300 in comparison with a LNA which has a constant voltage bias. Applicants compared a best case manufacturing corner, i.e., a manufactured device having a best performance, and a worst case manufacturing corner, i.e., a manufactured device having a worst performance, to determine the variation of several operating parameters for different LNAs. A DC current, $I_{DC}$, for a constant voltage bias LNA operated near the threshold voltage had a variation of 218% between the best manufacturing corner and the worst manufacturing corner. In contrast, a DC current, $I_{DC}$, variation for a LNA operated near the threshold voltage having a constant current bias had a variation of only 8%. Similar improvements were noted for gain and noise factor (NF). The LNA having the constant voltage bias exhibited a gain variation of 132% as compared with a variation of the gain for the LNA having the constant current bias of only 33%. The LNA having the constant voltage bias exhibited a NF variation of 56% as compared with a variation of the NF for the LNA having the constant current bias of only 6%. These results indicate the significant reduction in sensitivity to corner variation for LNA 300 in comparison with a LNA having a constant voltage bias.

Variation within a wafer is also reduced for LNA 300 in comparison with the LNA having the constant voltage bias. During a manufacturing process, multiple LNAs are formed on a same wafer. These LNAs are then diced and packaged with other circuits to form a semiconductor device, such as wireless personal area networks (WPANs), automobile radar, image sensing, wearable electronics or other suitable semiconductor devices. As discussed above, corner variation occurs across a single wafer as well as between different wafers. Applicants compared a performance of different LNAs manufactured on a same wafer. LNAs having a constant voltage bias exhibited a DC current, $I_{DC}$, having a standard deviation of 9.12% and a gain having a standard deviation of 41.1%. In contrast, different LNAs 300 manufactured on a same wafer exhibited a standard deviation of a DC current, $I_{DC}$, of 4.16% and a standard deviation of gain of 28.94%. In comparison with LNAs having the constant voltage bias, the variation of the LNAs 300 was reduced by 54.4% for DC current, $I_{DC}$, and 29.6% for gain.

LNA 300 exhibits an even lower sensitivity to corner variation when compared with a LNA having a constant voltage bias biasing an LNA near a threshold voltage. In some embodiments, LNA 300 is operated at a super threshold voltage. In embodiments where LNA 300 is operated at a super threshold voltage, LNA 300 exhibits a lower sensitivity to corner variation in comparison with a LNA having a constant voltage bias operating at a super threshold voltage. LNA 300 consumes approximately 6% of the DC power consumed by the LNA having the constant voltage bias operated at the super-threshold voltage. A figure of merit (FOM) of LNA 300 is approximately 7.4 times greater than a FOM of the LNA having the constant voltage bias operated at the super-threshold voltage. A FOM is a benchmark standard for comparing dissimilar LNA. In this description FOM is determined based on the following equation:

$$FOM = Gain/[(NF-1\_x P_{DC}]$$

where FOM is the figure of merit, Gain is a magnitude in decibels (dB), NF is a noise factor magnitude in dB, and $P_{DC}$ is a DC power consumption in milliwatts (mW).

However, an area of LNA 300 is approximately 60% larger than an area of the LNA having the constant voltage bias operated at the super-threshold voltage due to the inclusion of constant current bias circuit 330.

Figure 4:
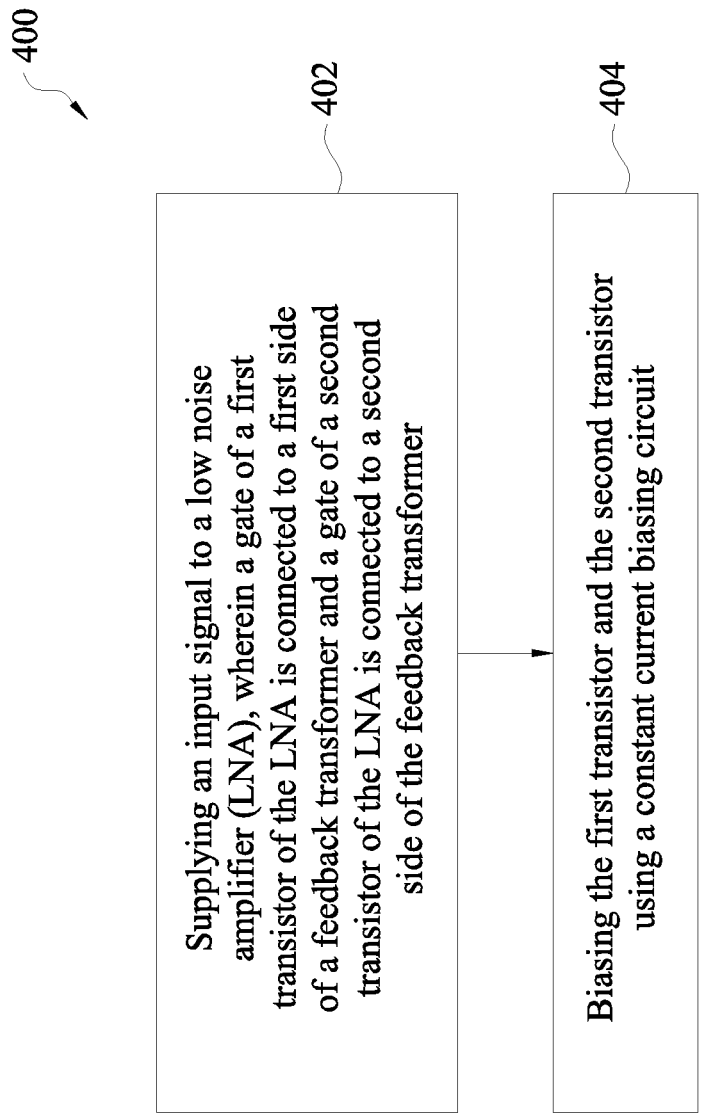
FIG. 4 is a flow chart of a method of using a LNA having a transformer feedback in accordance with some embodiments.

FIG. 4 is a flow chart of a method 400 of using a LNA in accordance with some embodiments. Method 400 begins with operation 402 in which an input signal is supplied to a LNA. The LNA includes a first transistor, e.g., first transistor M1 (FIGS. 1-3), having a gate connected to a primary winding of a feedback transformer, e.g., feedback transformer TF (FIG. 1) or feedback transformer TF' (FIGS. 2 and 3), and a second transistor, e.g., second transistor M2 (FIGS. 1-3), having a gate connected to a secondary winding of the feedback transformer. The input signal is applied to the gate of the first transistor via the feedback transformer. The first transistor and the second transistor are operated at a near-threshold voltage. In some embodiments, the LNA has a cascode structure. In some embodiments, the LNA has a concurrent structure. In some embodiments, the feedback transistor maintains an in phase voltage applied to the gate of the first transistor and to the gate of the second transistor.

In some embodiments, the feedback transistor maintains an out of phase voltage applied to the gate of the first transistor and to the gate of the second transistor.

In operation 404, the first transistor and the second transistor are biased using a constant current biasing circuit. The constant current biasing circuit, e.g., constant current biasing circuit 330 (FIG. 3), is connected to the gate of the first transistor and to the gate of the second transistor. In some embodiments, the constant current biasing circuit includes at least one bandgap current source. In some embodiments, the constant current biasing circuit includes a current mirror.

In some embodiments, method 400 includes additional operations. In some embodiments, an order of operations of method 400 is reversed.

One aspect of this description relates to a low noise amplifier (LNA). The LNA includes a first transistor and a second transistor. A source of the second transistor is connected to a drain of the first transistor. The LNA further includes a feedback transformer. A gate of the first transistor is connected to a primary winding of the feedback transformer and a gate of the secondary transistor is connected to a second winding of the feedback transformer.

Another aspect of this description relates to a low noise amplifier (LNA). The LNA includes a first transistor, and a second transistor. A source of the second transistor is connected to a drain of the first transistor. The LNA further includes a feedback transformer. A gate of the first transistor is connected to a primary winding of the feedback transformer and a gate of the second transistor is connected to a secondary winding of the feedback transformer. The LNA further includes a constant current biasing circuit configured to bias the first transistor and the second transistor.

Still another aspect of this description relates to a method of using a low noise amplifier (LNA). The method includes supplying an input signal to the LNA. The LNA includes a first transistor connected to a second transistor, and a feedback transformer connected to a gate of the first transistor and to a gate of the second transistor. The method further includes biasing the first transistor and the second transistor using a constant current biasing circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A low noise amplifier (LNA) comprising:
a first transistor;
a second transistor, wherein a source of the second transistor is connected to a drain of the first transistor; and
a feedback transformer, wherein a gate of the first transistor is connected to a primary winding of the feedback transformer and a gate of the second transistor is connected to a secondary winding of the feedback transformer, wherein the secondary winding of the feedback transformer is configured to control a voltage level supplied to the gate of the second transistor.

2. The LNA of claim 1, wherein the first transistor is a common source gain stage and the second transistor is a common gate gain stage.

3. The LNA of claim 1, wherein the first transistor is a common source gain stage and the second transistor is a common source gain stage.

4. The LNA of claim 1, further comprising an input node connected to the gate of the first transistor via the feedback transformer.

5. The LNA of claim 1, further comprising an output node connected to a drain of the second transistor.

6. The LNA of claim 1, further comprising a radio frequency (RF) choke between the drain of the first transistor and the source of the second transistor.

7. The LNA of claim 6, wherein the RF choke comprises an LC circuit.

8. The LNA of claim 1, further comprising an alternating current (AC) short connected to the source of the second transistor.

9. The LNA of claim 1, further comprising a constant current biasing circuit connected to the gate of the first transistor and the gate of the second transistor.

10. The LNA of claim 9, wherein the constant current biasing circuit is connected to the gate of the second transistor at a node between the gate of the first transistor and the feedback transformer.

11. The LNA of claim 9, wherein the constant current biasing circuit is connected to the gate of the first transistor at a node between the gate of the second transistor and the feedback transformer.

12. The LNA of claim 9, wherein the constant current biasing circuit comprises:
a first current generator;
a second current generator; and
a current mirror connected to the first current generator and the second current generator.

13. The LNA of claim 12, wherein at least one of the first current generator or the second current generator is a bandgap current source.

14. The LNA of claim 12, wherein the current mirror comprises a third transistor, a gate of the third transistor is connected to the gate of the second transistor, and a drain of the third transistor is connected to the gate of the first transistor.

15. A low noise amplifier (LNA) comprising:
a first transistor;
a second transistor, wherein a source of the second transistor is connected to a drain of the first transistor;
a feedback transformer, wherein a gate of the first transistor is connected to a primary winding of the feedback transformer and a gate of the second transistor is connected to a secondary winding of the feedback transformer, wherein the secondary winding of the feedback transformer is configured to control a voltage level supplied to the gate of the second transistor; and
a constant current biasing circuit configured to bias the first transistor and the second transistor.

16. The LNA of claim 15, wherein the LNA has a cascode structure.

17. The LNA of claim 15, wherein the LNA has a concurrent structure.

18. The LNA of claim 15, wherein the feedback transformer is configured to maintain an in phase signal at the gate of the first transistor and at the gate of the second transistor.

19. The LNA of claim 15, wherein the feedback transformer is configured to maintain an out of phase signal at the gate of the first transistor and at the gate of the second transistor.

20. A method of using a low noise amplifier (LNA), the method comprising:
supplying an input signal to the LNA, wherein the LNA comprises a first transistor connected to a second transistor, and a feedback transformer connected to a gate of the first transistor and to a gate of the second transistor, wherein the feedback transformer is configured to control a voltage level supplied to the gate of the second transistor; and
biasing the first transistor and the second transistor using a constant current biasing circuit.

\* \* \* \* \*